United States Patent [19]
Smith et al.

[11] Patent Number: 5,944,537
[45] Date of Patent: Aug. 31, 1999

[54] PHOTOLITHOGRAPHICALLY PATTERNED SPRING CONTACT AND APPARATUS AND METHODS FOR ELECTRICALLY CONTACTING DEVICES

[75] Inventors: Donald L. Smith, Santa Clara; Robert L. Thornton, Los Altos; Christopher L. Chua, Mountain View; David K. Fork, Los Altos, all of Calif.

[73] Assignee: Xerox Corporation, Stamford, Conn.

[21] Appl. No.: 08/990,508

[22] Filed: Dec. 15, 1997

[51] Int. Cl.$^6$ ............................... H01R 9/03; H05K 1/14
[52] U.S. Cl. ............................ 439/81; 439/74; 200/275
[58] Field of Search .................... 439/66, 74, 81, 439/91, 482, 591; 361/772, 774, 776; 200/245, 246, 250, 292, 275, 282

[56] References Cited

U.S. PATENT DOCUMENTS

| | | |
|---|---|---|
| 4,320,438 | 3/1982 | Ibrahim et al. . |
| 4,359,414 | 11/1982 | Mastrangelo . |
| 4,423,401 | 12/1983 | Mueller . |
| 4,696,832 | 9/1987 | Wright . |
| 4,758,927 | 7/1988 | Berg . |
| 5,121,298 | 6/1992 | Sarma et al. . |
| 5,152,695 | 10/1992 | Grabbe et al. . |
| 5,280,139 | 1/1994 | Suppelsa et al. . |
| 5,613,861 | 3/1997 | Smith et al. ........................ 439/81 |
| 5,665,648 | 9/1997 | Little . |
| 5,848,685 | 12/1998 | Smith et al. ...................... 200/275 |

FOREIGN PATENT DOCUMENTS

| | | |
|---|---|---|
| 6-249880 | 9/1994 | Japan . |
| 9409374 | 4/1994 | WIPO . |
| 9641506 | 12/1996 | WIPO . |

OTHER PUBLICATIONS

K. Bohringer, "Computational Methods for Design and Control of MEMS Actuator Arrays," Sep. 12, 1997, Abstract from Seminar.

A. Lee, J. Hamilton, J. Trevino, "A Low Power, Tight Seal, Polyimide Electrostatic Microvalve," Micro–Electro–Mechanical Systems ASME, Dynamic Systems and Control Disvision Publication, v. 56, pp. 345–349, Nov. 17,1996.

A.E. "Bill" Corwith, "Probing at Die Level," *Advanced Packaging*, Jan./Feb. 1995, pp. 26 & 28 IBM Technical Disclosure vol. 34 No. 7B, Dec. 1991.

Donald L. Smith et al., "Flip–Chip Bonding On 6–Um Pitch Using Thin–Film Microspring Technology," to be published in Proc. 48th Electronic Components And Technology Conf., May 1998.

Donald L. Smith et al., "A New Flip–Chip Technology for High–Density Packaging," Proc. 46$^{th}$ Electronic Components and Technology Conf., May 1996.

Donald L. Smith et al., "A New, High–Compliance Flip-–Chip Technology," Display Works Conference, Feb. 1996.

*Primary Examiner*—Ren Yan
*Attorney, Agent, or Firm*—Oliff & Berridge, PLC

[57] ABSTRACT

A photolithographically patterned spring contact is formed on a substrate and electrically connects contact pads on two devices. The spring contact also compensates for thermal and mechanical variations and other environmental factors. An inherent stress gradient in the spring contact causes a free portion of the spring contact to bend up and away from the substrate. An anchor portion remains fixed to the substrate and is electrically connected to a first contact pad on the substrate. The spring contact is made of an elastic material and the free portion compliantly contacts a second contact pad, thereby electrically interconnecting the two contact pads.

14 Claims, 15 Drawing Sheets

5,944,537

PHOTOLITHOGRAPHICALLY PATTERNED SPRING CONTACT AND APPARATUS AND METHODS FOR ELECTRICALLY CONTACTING DEVICES

RELATED APPLICATIONS AND PATENTS

This application is related to U.S. Pat. No. 5,613,861, which is hereby incorporated by reference in its entirety. This application is also related to U.S. patent application Ser. Nos. 08/771,405, filed Dec. 20, 1996, and 08/770,285, filed Dec. 20, 1996.

BACKGROUND OF THE INVENTION

1. Field of Invention

This invention generally relates to photolithographically patterned spring contacts for use in electrically connecting integrated circuits, circuit boards, electrode arrays, or other devices.

2. Description of Related Art

Standard bonding techniques for electrically connecting integrated circuits, or chips, to a circuit board or other device include wire bonding, tab bonding, solder-bump and gold-bump flip-chip bonding and other techniques. FIG. 1 shows a contact pad 3 formed on a chip 2 wire bonded to a corresponding contact pad 3 formed on a substrate 1. The contact pads 3 are electrically connected, or bonded, by a wire 4. Since the chip 2 typically has tens or even hundreds of the contact pads 3, wire bonding each contact pad 3 on the chip 2 to the corresponding contact pad 3 on the substrate 1 is labor intensive, expensive and slow. Further, the contact pads 3 must be large enough to accommodate both the wire 4 and 10 the accuracy of the wire bonding device used to create the wire bond. Therefore, the contact pads 3 are made larger than otherwise necessary to compensate for the size limitations of the wire 4 and the wire bonding device.

FIG. 2 shows the contact pad 3 formed on the chip 2 tab bonded to the corresponding contact pad 3 on the substrate 1. A flexible substrate 5 having conductive lines formed on its lower surface is forced against the contact pads 3. A layer of anisotropic adhesive (not shown) is placed between the contact pads 3 and the flexible substrate 5. When the flexible substrate 5 is pressed against the contact pads 3, the anisotropic adhesive and the conductive lines formed on the flexible substrate 5 cooperate to complete the electrical connection between the contact pads 3. Like wire bonding, tab bonding suffers from yield loss, bond fragility, and high cost.

Another conventional method for bonding the contact pads 3 formed on the chip 2 to the contact pads 3 formed on the substrate 1 or to some other device is solder-bump flip-chip bonding. FIG. 3 shows the chip 2 inverted with the contact pads 3 facing toward the substrate 1. The name "flip-chip" derives from the inversion of the chip 2, since the chip 2 is "flipped over" with the contacts pads 3 facing the substrate 1, in contrast to both tab bonding and wire bonding where the contact pads 3 on the chip 2 face away from the substrate 1. Note, however, that tab bonding can also be done with the chip 2 "flipped over". In standard flip-chip bonding, solder bumps 6 are formed on the contact pads 3 on the substrate 1 or on the chip 2. The electrical connection between the corresponding contact pads 3 is completed by pressing the contact pads 3 on the chip 2 against the solder bumps 6 and melting the solder bumps 6.

Flip-chip bonding is an improvement over both wire bonding and tab bonding. The relatively soft solder bumps 6 tend to permanently deform when the chip 2 is pressed down against the solder bumps 6. This deformation of the solder bumps 6 compensates for some irregularity in the heights of the contact pads 3 and any uneven contacting pressure forcing the chip 2 against the solder bumps 6.

However, flip-chip bonding does suffer from both mechanical and thermal variations in the solder bumps 6. If the solder bumps 6 are not uniform in height or if the substrate 1 is warped, contact between the contact pads 3 and the solder bumps 6 can be broken. Also, if the contacting pressure forcing the chip 2 down on the solder bumps 6 is uneven, contact between some contact pads 3 and corresponding solder bumps 6 can fail. In addition, stresses from thermal expansion mismatches between the chip 2 and the substrate 1 can break the bonds formed by the solder bumps 6.

In contrast to the relatively permanent bonds described above, FIG. 4 shows a standard technique for establishing a temporary electrical contact between two devices. A probe card 7 having a plurality of probe needles 8 contacts the contact pads 3 by physically pressing the probe needles 8 against the contact pads 3. The physical contact between the probe needles 8 and the contact pads 3 creates an electrical connection between the probe needles 8 and the lines 9 formed on the substrate 1.

The probe cards 7 are generally used to create only temporary contacts between the probe needles 8 and the contact pads 3, so that the device 10 can be tested, interrogated or otherwise communicated with. The device 10 can be a matrix of display electrodes which are part of an active-matrix liquid crystal display.

The probe cards 7 have many more applications than only for testing liquid crystal displays. Any device 10, for example, a silicon wafer having a plurality of integrated circuits formed on the wafer, having numerous and relatively small contact pads 3, similar to those found on the chip 2, can be tested using the probe card 7. However, standard techniques for producing the probe card 7 are time consuming and labor-intensive. Each probe card 7 must be custom-made for the particular device 10 to be tested. Typically, the probe needles 8 are manually formed on the probe card 7. Because the probe cards 7 are custom-made and relatively expensive, the probe cards 7 are not typically made to contact all of the contact pads 3 on the device 10 at one time. Therefore, only portions of the device 10 can be communicated with, tested or interrogated at any one time, requiring the probe card 7 be moved to allow communication, testing or interrogation of the entire device 10.

The probe cards 7 are also used to test the chips 2 while the chips 2 are still part of a single-crystal silicon wafer. One such probe card 7 is formed by photolithographic pattern plated processing, as disclosed in *Probing at Die Level*, Corwith, Advanced Packaging, February, 1995, pp. 2628. Photolithographic pattern plated processing produces probe cards 7 which have essentially the same design as the standard probe card 7. However, this new type of processing appears to automate the method for producing probe needles 8, thus avoiding manually forming the probe needles 8. Also, this article discloses a probe card 7 which is bent at the end nearest the probe needles 8, as shown in FIG. 5. The bend in the probe card 7 allows the probe needles 8 to contact the contact pad 3 at an angle. As the probe card 7 pushes the probe needles 8 into the contact pads 3, a mechanical scrubbing action occurs which allows the probe needles 8 to break through the oxide formed on the top surface of the contact pad 3. However, although the Corwith device is limited to probing linear arrays, not all standard probe cards 7 are limited to testing contact pads 3 which are arranged in a linear array. Some probe cards 7 are capable of contacting a rectangular, or other, array of contact pads 3.

SUMMARY OF THE INVENTION

Accordingly, this invention provides a spring contact which exhibits the speed and ease of solder-bump flip-chip bonding while eliminating the need to create uniform solder bumps or uniform contacting pressure. Also, the invention provides finer-pitch contact arrays than solder-bump flip-chip bonding.

This invention further provides a spring contact which has elastic properties enabling the spring contact to maintain physical contact with a contact pad despite variations in contact pad heights, contacting pressure, thermal variations or mechanical shock.

This invention also provides an elastic spring contact having a stress gradient formed in the spring contact, which causes the spring contact to bend away from the substrate and thus provide compliant contact with a contact pad.

The spring contacts of this invention are formed of a thin metal strip which is in part fixed to a substrate and electrically connected to a contact pad on the substrate. The free portion of the metal strip not fixed to the substrate bends up and away from the substrate. When a contact pad on a device is brought into pressing contact with the free portion of the metal strip, the free portion deforms and provides compliant contact with the contact pad. Since the metal strip is electrically conductive or coated with a conductive material, the contact pad on the substrate is electrically connected to the contact pad on the device via the spring contact.

In one aspect of the invention, the portion of the spring contact which contacts a contact pad is formed from a material having a high hardness, such as a tungsten (W) or chromium (Cr) alloy. The high hardness contacting tip of the spring contact provides reliable contacting with contact pads having a hard oxide layer, such as aluminum oxide, decreases wear of the spring contact tip, and thus provides for increased service life of the spring contact.

In one aspect of the invention, the contacting surface of the spring contacts are coated with electrically conductive compounds, such as titanium nitride (TiN), diamond-like carbon (DLC), molybdenum disulfide ($MoS_2$), and tin dioxide ($SnO_2$). These coatings provide various advantages, such as increasing the hardness of the contacting surface of the spring contact and providing a lubricant to prevent galling of the spring contact and/or a contact pad.

This invention also provides an elastic spring contact having an inherent stress gradient that causes the free portion of the spring contact to bend away from a substrate to form a "shepherd's hook" shape. This structure provides for a larger area for contacting a corresponding contact pad and for higher mechanical compliance, which decreases joint stresses created by vibration, mechanical shock and/or thermal cycling.

The invention further provides a spring contact and corresponding contact pad that has a linear chain conducting polymer applied at and around the contact point between the spring contact and the contact pad. The linear chain conducting polymer is nominally a high viscosity, low vapor pressure liquid having a high molecular weight, or may be converted to such form by moderate temperature elevation. This linear chain conducting polymer has the property that, in the presence of a sufficiently high electric field, the polymer changes from an insulating material to a conducting one. Thus, when the electrical connection between the contact pad and the spring contact is broken, a high electric field is generated near the former point of contact and the polymer changes from an insulating state to a conducting state, thereby reestablishing electrical contact. The polymer also acts as a barrier material, preventing the contact region from being exposed to potential contaminants that could otherwise degrade the quality of the electrical connection between the spring contact and the contact pad.

This invention also provides a spring contact that is bonded to a corresponding contact pad. The spring contact can be bonded to the contact pad by a direct solder connection between the spring contact and the contact pad, or by an electrically conductive epoxy or laser welding. In addition to being applied locally at each spring contact/contact pad connection, an adhesive or other similar material can be used to bond not only the spring contacts to the contact pads, but also bond two electrically connected devices.

BRIEF DESCRIPTION OF THE DRAWINGS

This invention will be described in relation to the following drawings, in which reference numerals refer to like elements and wherein.

DETAILED DESCRIPTION OF PREFERRED EMBODIMENTS

Figure 6:
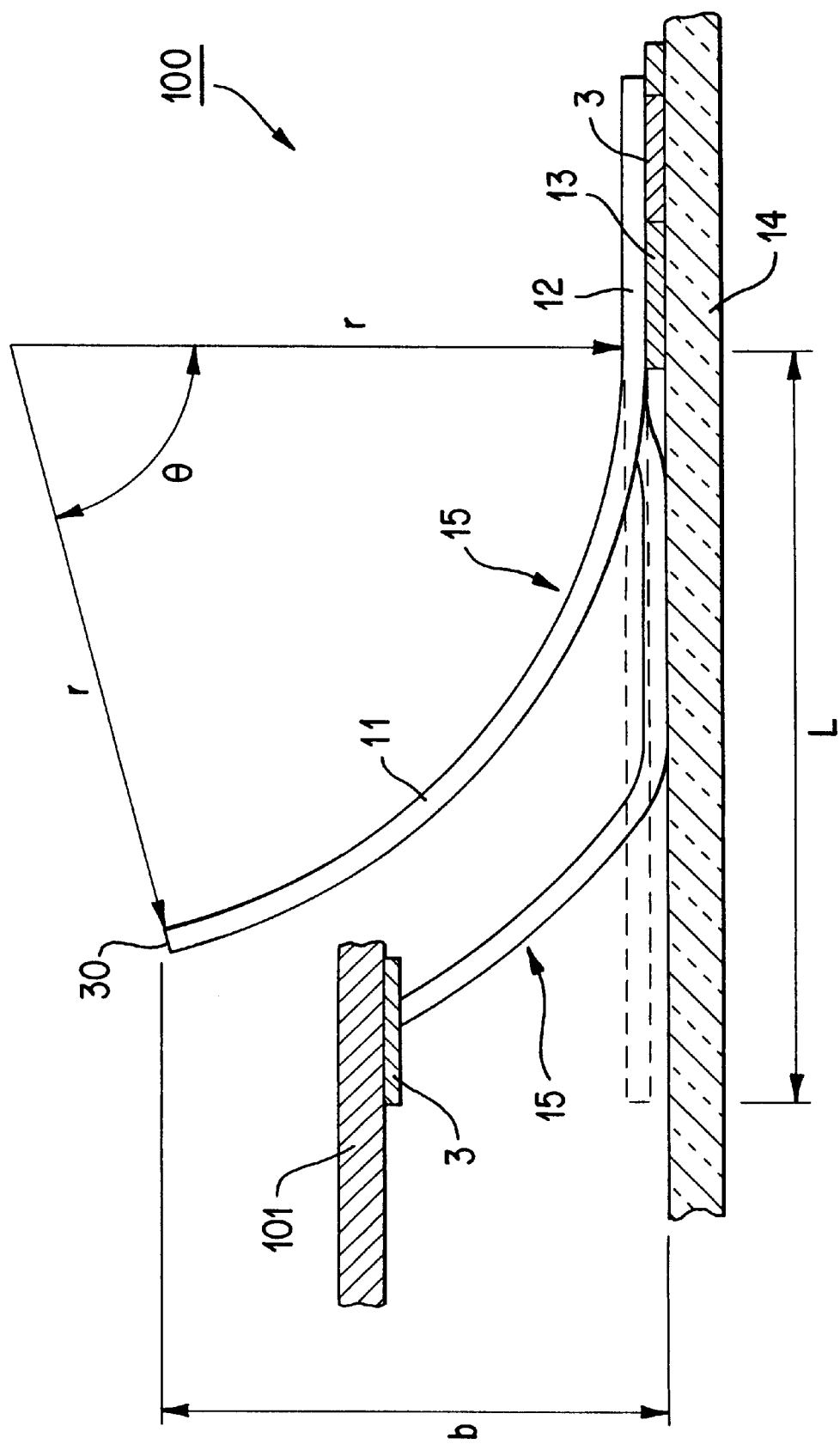
FIG. 6 is a spring contact in an undeformed free state and another spring contact deformed when contacting a contact pad.

FIG. 6 shows a side view of a bonding structure 100 having a plurality of spring contacts 15. Each spring contact 15 comprises a free portion 11 and an anchor portion 12 fixed to a release layer 13 and electrically connected to a contact pad 3. Each spring contact 15 is made of an extremely elastic material, such as a chrome-molybdenum alloy or a nickel-zirconium alloy. Preferably, the spring contacts 15 are formed of an elastic conductive material, although they can be formed of a non-conductive or semi-conductive material if they are coated or plated with a conductor material. More preferably, the spring contacts 15 are formed of a nickel-zirconium alloy having 1% zirconium, a chrome-molybdenum alloy (20% Cr–80% Mo), a tungsten (W)-based alloy, or a chromium (Cr) based alloy. Zirconium is added to the nickel in the nickel-zirconium alloy to improve the elastic properties of the alloy while not greatly reducing the conductivity of the nickel. When the elastic material is not conductive, it is coated on at least one side with a conductive material, such as a metal or metal alloy.

The contact pad 3 is the terminal end of a communication line which electrically communicates with an electronic device formed on the substrate 14 or device 101 such as a transistor, a display electrode, or other electrical device. The contact pad 3 is typically made of aluminum, but can be made of any conductive material. If the contact pad 3 on the device 101 is made of aluminum, the contact pad 3 is preferably coated with a conductive material, such as gold, indium tin oxide, or nickel. This allows the spring contact 15 to make better electrical contact with the contact pad 3, since the spring contact 15 is not required to "scrub" the uncoated contact pad 3 to break through the aluminum oxide that forms on an uncoated aluminum contact pad 3. The release layer 13 is made of silicon nitride or other etchable material, which can be electrically insulating or conducting. However, the release layer 13 is not necessary and can be eliminated. The release layer 13 and the contact pad 3 are formed on or over a substrate 14, which is also formed of an insulating material, such as oxidized silicon or glass.

Figure 1:
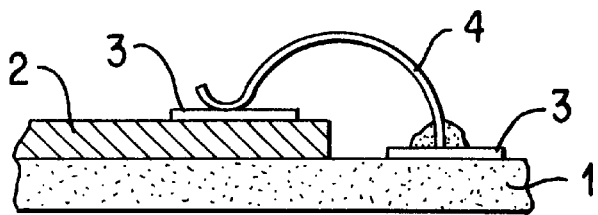
FIG. 1 shows a chip wire bonded to a substrate.
Figure 2:
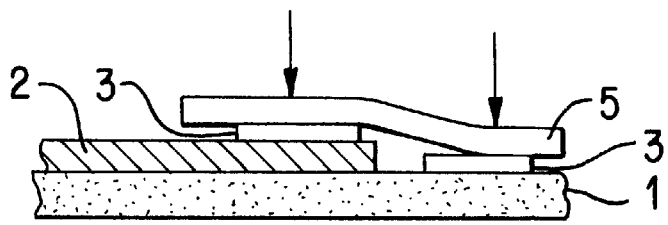
FIG. 2 shows the chip tab bonded to the substrate.
Figure 3:
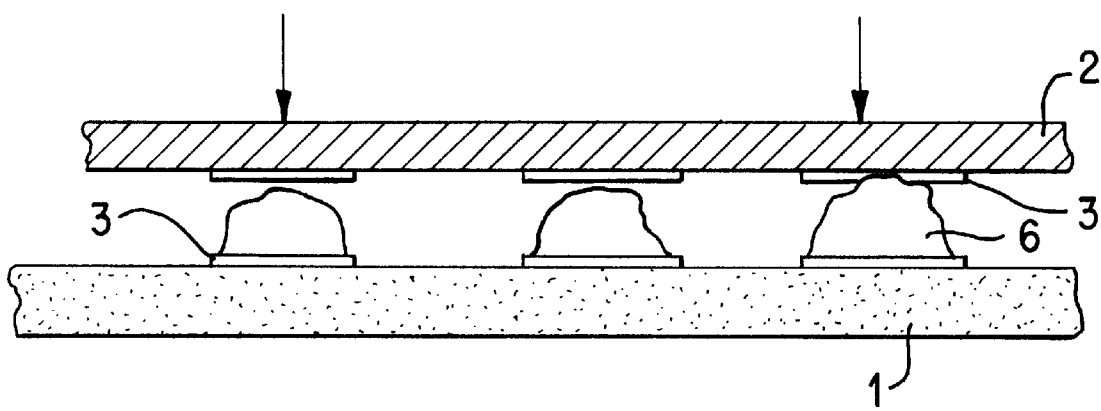
FIG. 3 shows the chip solder-bump flip-chip bonded to the substrate.
Figure 4:
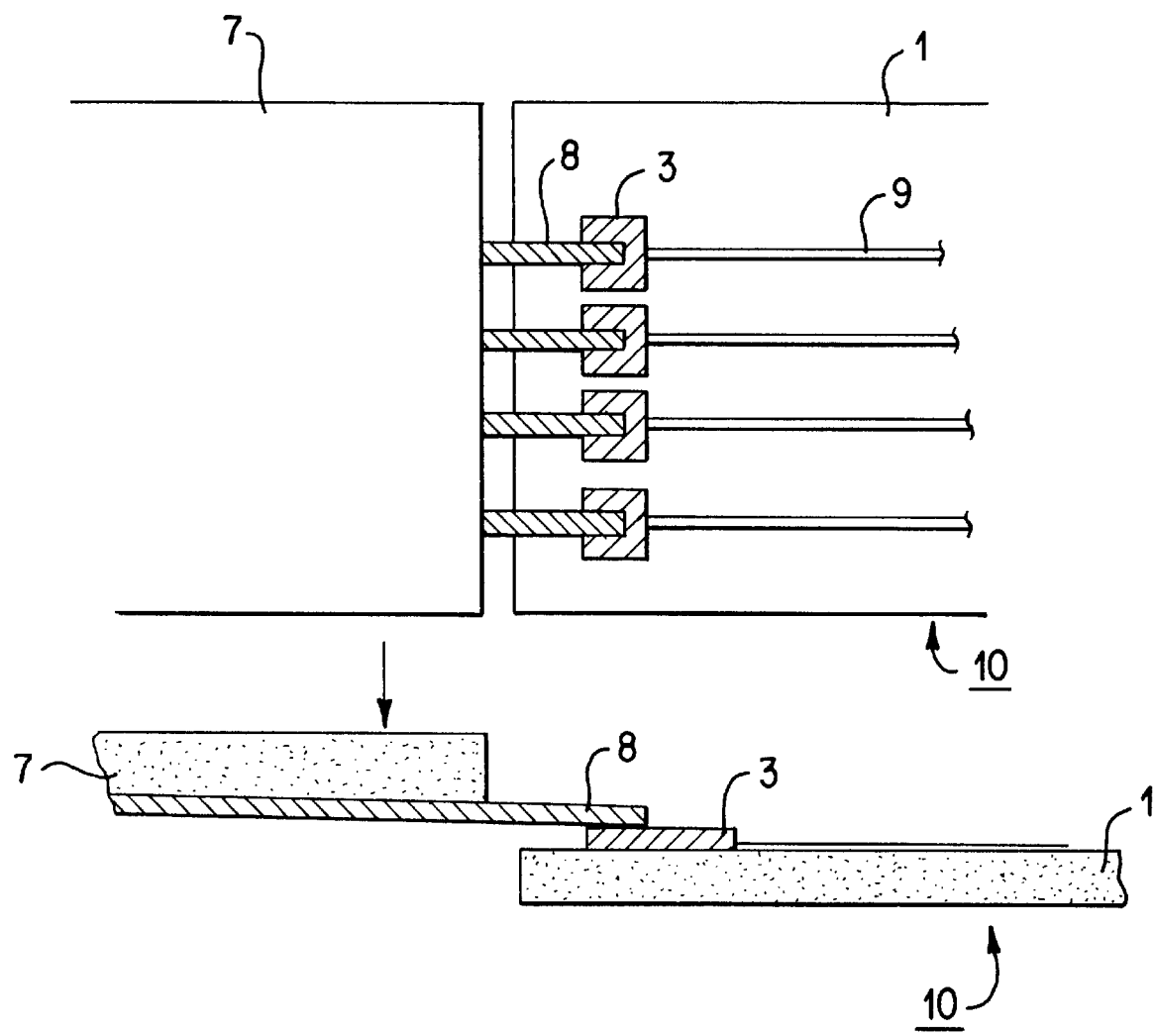
FIG. 4 shows a probe card contacting an electronic device.
Figure 5:
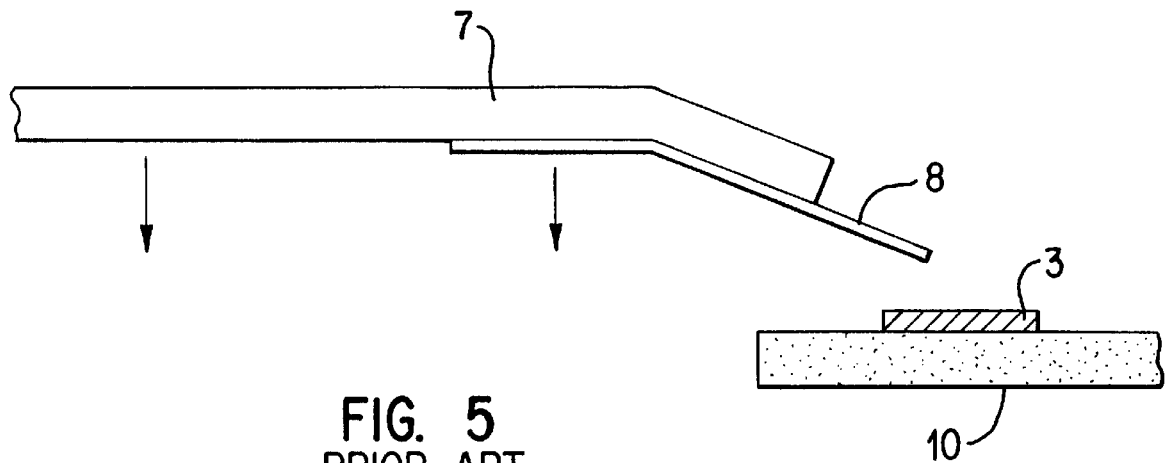
FIG. 5 shows a probe card having an angled probe needle.
Figure 7:
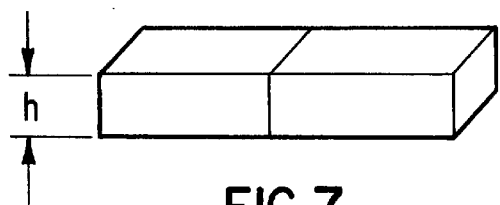
FIG. 7 shows a metal strip with no stress gradient.
Figure 8:
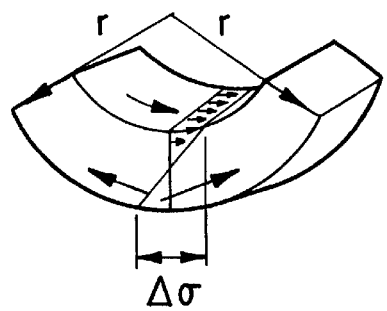
FIG. 8 shows a model for determining the curvature of a spring contact due to a stress gradient.

As shown in FIG. 7, a strip of metal having no stress gradient inherent in the metal will lie flat. However, as shown in FIG. 8, when the strip is bent into an arc, a uniform stress gradient $\Delta\sigma/h$ is introduced into the strip. Likewise, if a uniform stress gradient $\Delta\sigma/h$ is introduced into the flat metal strip, the metal strip will bend into an arc shape.

Each spring contact 15 is formed such that a stress gradient $\Delta\sigma/h$ is introduced into the spring contact 15. When the spring contact 15 is formed, the metal layer comprising the spring contact 15 is deposited such that compressive stress is present in lower portions of the metal layer and tensile stress is present in upper portions of the metal layer. Compressive stress in lower portions of the metal layer is depicted by arrows directed toward the ends of the metal strip. Tensile stress is depicted in upper portions of the metal layer by arrows directed in from the ends of the metal strip. The stress gradient $\Delta\sigma/h$ causes the spring contact 15 to bend into the shape of an arc having a radius r. Equation 1 gives the radius of curvature r of the spring contact 15:

$$r = \left(\frac{Y}{1-v}\right)\frac{h}{\Delta\sigma} \quad (1)$$

where Y is the Young's modulus of the metal, h is the thickness of the metal layer forming the spring contact 15, $\Delta\sigma$ is the total stress difference, and v is the Poisson's ratio of the metal.

Figure 9:
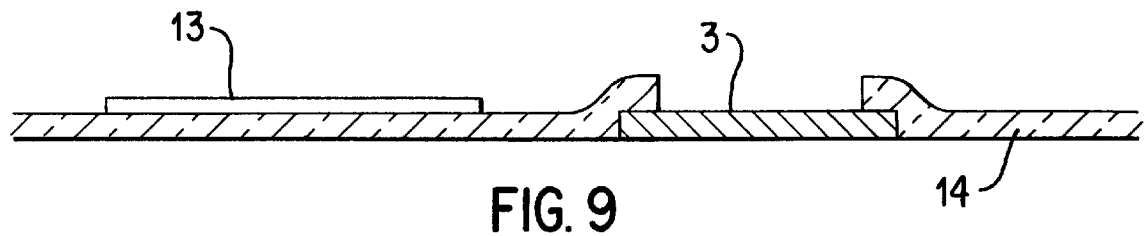
FIGS. 9–12 show the steps for forming a spring contact.

FIGS. 9–12 show the basic steps in forming a spring contact 15. In FIG. 9 a contact pad 3 is formed on or over a substrate 14. Additionally, an release layer 13 is formed on or over the substrate 14. However, as mentioned above, the release layer 13 is not required and can be eliminated.

Figure 10:
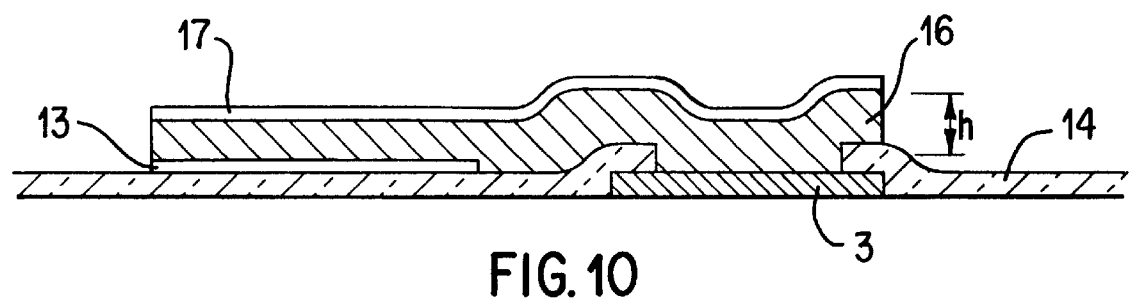

In FIG. 10, a layer of metal 16 is deposited on or over the substrate 14. In a preferred embodiment of the invention, the metal is the nickel-zirconium alloy described above. Part of the metal layer 16 is electrically connected to or directly contacts the contact pad 3 and another portion of the metal layer 16 is deposited on or over the release layer 13. There are many methods available for depositing a metal layer 16 on or over the substrate 14, including electron-beam deposition, thermal evaporation, chemical vapor deposition, sputter deposition and other methods. Preferably, the metal layer 16 is sputter deposited.

When sputter-depositing a metal, a plate of the metal, called the target, is placed on a cathode, which is set to a high negative potential and immersed in a low-pressure, typically 1 to 100 millitorr, gas. This causes a glow-discharge plasma to ignite, from which positive ions are accelerated into the negatively charged target. This ion bombardment knocks metal atoms off the target, and many of these deposit on nearby surfaces, such as the substrate 14.

The metal layer 16 can be thought of as deposited in several sub-layers 16-1 to 16-n to a final thickness h of approximately 1 $\mu$m. The stress gradient $\Delta\sigma/h$ is introduced into the metal layer 16 by altering the stress inherent in each of the sub-layers 16-1 to 16-n of the metal layer 16, as shown in FIG. 10, each sub-layer 16-x having a different level of inherent stress.

Different stress levels can be introduced into each sub-layer 16-x of the deposited metal layer 16 during sputter deposition in a variety of ways, including adding a reactive gas to the plasma, depositing the metal at an angle, and changing the pressure of the plasma gas. Preferably, the different levels of stress are introduced into the metal layer 16 by varying the pressure of the plasma gas, which is preferably argon.

Figure 13:
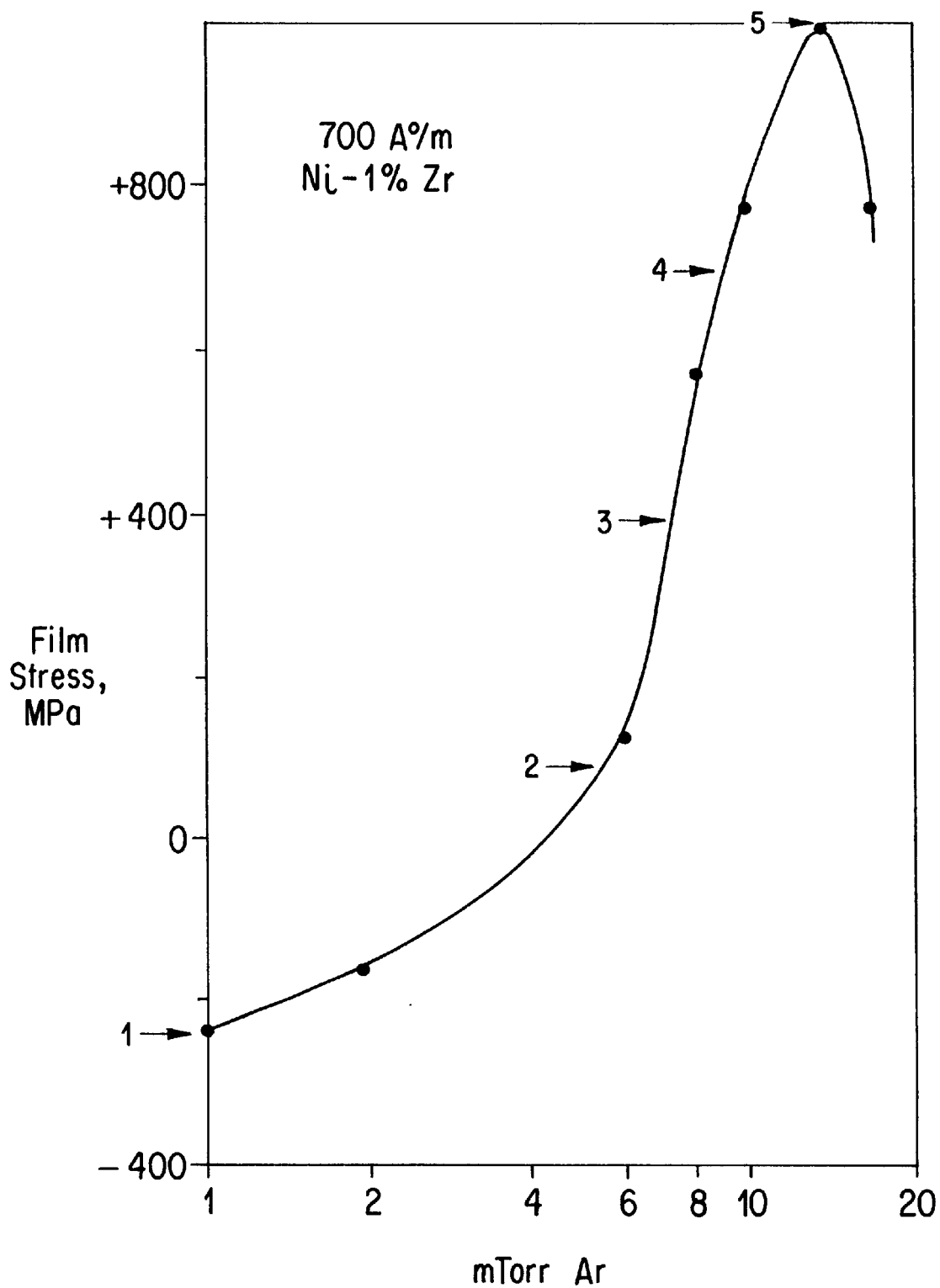
FIG. 13 is a graphic representation of the film stress in a sputter deposited nickel-zirconium alloy as a function of plasma gas pressure.

FIG. 13 is a graph showing a typical relationship of the film stress in the sputter deposited nickel-zirconium alloy and the pressure of the plasma gas used in the deposition. For low pressures of the plasma gas, approximately 1 mTorr, the film stress in the deposited metal is compressive. As the pressure of the plasma gas increases, the film stress in the deposited sub-layer changes to a tensile stress and increases with increasing plasma gas pressure.

Preferably, the metal layer 16 is deposited in five sub-layers 16-1 to 16-5. The first sub-layer 16-1 is deposited at a plasma gas pressure of 1 mTorr, as indicated by numeral 1 in FIG. 13. The first sub-layer 16-1 is the bottom-most layer in the metal layer 16 and has an inherent compressive stress. The second sub-layer 16-2 is deposited on top of the first sub-layer 16-1 at a plasma gas pressure of approximately 6 mTorr. The second sub-layer 16-2 has a slight inherent tensile stress, as indicated by numeral 2 in FIG. 13. Sub-layers 16-3, 16-4 and 16-5 are then deposited one on top of the other at the plasma gas pressures indicated by numerals 3, 4 and 5 in FIG. 13.

The process of depositing the metal layer 16 in five separate sub-layers 16-1 to 16-5 results in the metal layer 16 having a stress gradient $\Delta\sigma/h$ which is compressive in the lower portion of the metal layer 16 and becomes increasingly tensile toward the top of the metal layer 16. Although the stress gradient $\Delta\sigma/h$ urges the metal layer 16 to bend into an arc, the metal layer 16 adheres to the release layer 13, the substrate 14, and the contact pad 3, and thus lies flat.

Figure 14:
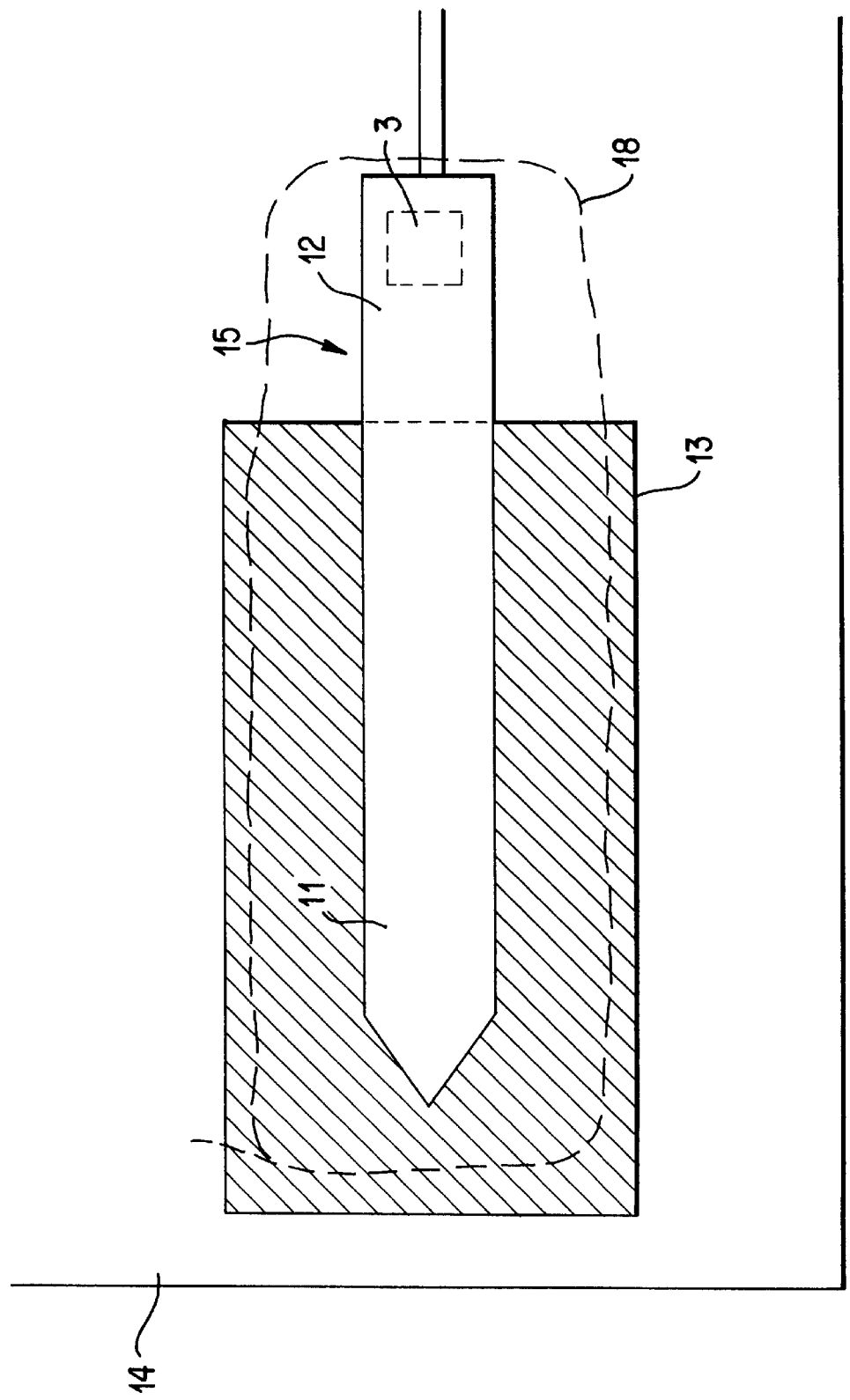
FIG. 14 is a top view of a spring contact.

After the metal layer 16 is deposited, the metal layer 16 is photolithographically patterned into the spring contacts 15. Photolithographic patterning is a well-known technique and is routinely used in the semiconductor chip industry. First, a positive photosensitive resist 17 is spun on top of the metal layer 16 and soft-baked at 90° C. to drive off solvents in the resist 17. The photosensitive resist 17 is exposed to an appropriate pattern of ultra-violet light and then developed. Exposed areas of the resist 17 are removed during developing and the remaining resist 17 is hard-baked at 120° C. Wet or plasma etching is then used to remove the exposed areas of the metal layer 16. The remaining areas of the metal layer 16 after etching form the spring contacts 15. A top-view of one spring contact 15 is shown in FIG. 14. The area of the metal layer 16 removed by the etching is described by the dashed line 18.

Figure 11:
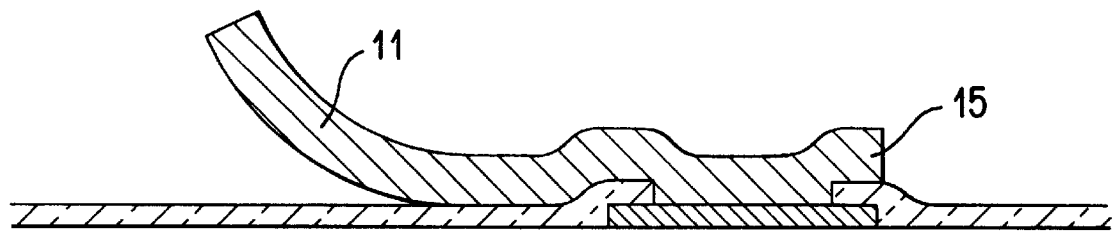

Next, as shown in FIG. 11, the free portion 11 of the spring contact 15 is released from the release layer 13 by a process of under-cut etching. Until the free portion 11 is released from the release layer 13, the free portion 11 adheres to the release layer 13 and the spring contact 15 lies flat on the substrate 14. There are two methods for releasing the spring contacts 15 from the substrate 14 or release layer 13. In the first method, the release layer 13, typically silicon nitride, is deposited by plasma chemical vapor deposition (PECVD) at a temperature of 200–250° C. This gives the release layer 13 a fast etch rate. The release layer 13 is then prepatterned, before the metal layer 16 is deposited, into islands on which the spring contacts 15 will be formed. After the spring contacts 15 are formed on or over the islands of the release layer 13, the spring contacts 15 are released from the release layer 13 islands by etching the islands with a selective etchant. The selective etchant is typically a HF solution. The etchant is called a selective etchant because it etches the release layer 13 faster than the selective etchant removes metal from the spring contacts 15. This means that the spring contacts 15 are released from the release layer 13 and are allowed to bend up and away from the release layer 13 due to the stress gradient $\Delta\sigma/h$ in the spring contacts 15. The islands can also be formed of a low melting temperature material, such as solder or plastic. After the spring contacts 15 are formed, the low melting temperature material is heated to release the spring contacts 15.

In the second method for releasing the spring contacts 15, the release layer 13, if used, is not pre-patterned into islands. Instead, after the spring contacts 15 are formed, a passivating layer, such as silicon oxynitride, is deposited on the spring contacts 15 and the surrounding areas by PECVD. The passivation layer is patterned into windows, such as the shaded area shown in FIG. 14 to expose the free portion 11 of the spring contacts 15 and surrounding areas of the release layer 13. The same selective etchant, the HF solution, is used to etch the release layer 13 and release the spring contacts 15. This method avoids a step discontinuity in the metal of the spring contact 15 at the anchor portion 12 edge and leaves an insulating cover on the anchor portion 12. The insulating cover protects the anchor portion 12 from short-circuiting and also helps hold the anchor portion 12 down on the substrate 14.

Only those areas of the release layer 13 under the free portion 11 of the spring contact 15 are under-cut etched. The area of release layer 13 under-cut etched for each spring contact 15 is described by the shaded portion in FIG. 14. This means that the anchor portion 12 of the spring contact 15 remains fixed to the release layer 13 and does not pull away from the release layer 13. It should be appreciated that the method for patterning the metal layer 16 into the spring contacts 15 should not result in any annealing of the metal layer 16.

Additional steps can be added to the under-cut etching processes to improve the processes if necessary. For example, etchant vias, or small windows, can be etched into the free portions 11 of the spring contacts 15. The etchant vias operate to provide the selective etchant faster access to the release layer 13, thereby speeding the process of releasing the free portions 11 from the release layer 13. Also, a hard mask, made of, for example, silicon, can be applied to the top surface of the spring contacts 15 to ensure that the etchant does not remove material from the top surface of the spring contacts 15 in case the photosensitive material 17 protecting the top of the spring contacts 15 fails during patterning of the spring contact 15.

Once the free portion 11 is freed from the release layer 13, the stress gradient $\Delta\sigma/h$ causes the free portion 11 to bend up and away from the substrate 14. The stress gradient $\Delta\sigma/h$ is still inherent in the anchor portion 12 and urges the anchor portion 12 to pull away from the substrate 14.

To decrease the chance of the anchor portion 12 pulling away from the substrate 14, the spring contact 15 can be annealed to relieve the stress in the anchor portion 12. This annealing process does not affect the free portion 11 because, once the free portion 11 is released and allowed to bend up, no stress remains on the free portion 11 to be relieved by annealing. Thus, the free portion 11 remains curved up and away from the substrate 14 after annealing.

Figure 12:
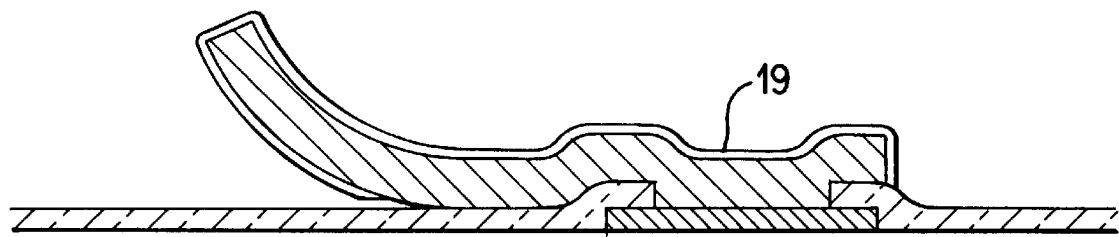

Finally, FIG. 12 shows a layer of gold 19 plated over the outer surface of each spring contact 15. The layer of gold 19 is preferably used to reduce the resistance in the spring contacts 15, but can be replaced with any other conductive material. Preferably, the gold layer 19 is sputter deposited on the release layer 13 before the spring contact 15 is deposited. Thus, the gold layer 19 is bonded to the spring contact 15 and is released from the release layer 13 during under-cut etching. Alternatively, an electroless plating process can also be used to coat the spring contact 15.

Since the process for forming the spring contacts 15 is limited only by the design rules of photolithographic patterning, many hundreds or thousands of spring contacts 15 can be formed closely together in a relatively small area on the substrate 14. The typical width w of the spring contact 15 is 10–100 $\mu$m. Therefore, the spring contacts 15 can be formed close together, at a spacing of approximately 10–20 $\mu$m. This makes the center-to-center distance between adjacent spring contacts 15 approximately 20–120 $\mu$m, which is within or less than the typical center-to-center distance between adjacent contact pads 3 on a standard semiconductor chip 2.

Figure 15:
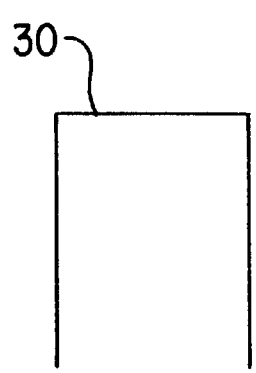
FIGS. 15–20 show a plurality of types of spring contact tips.
Figure 16:
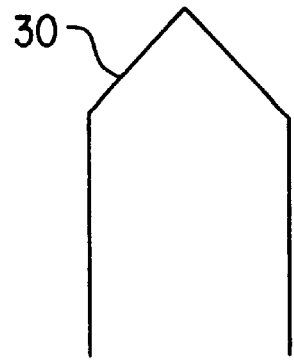
Figure 17:
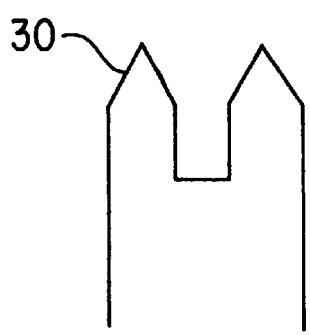
Figure 18:
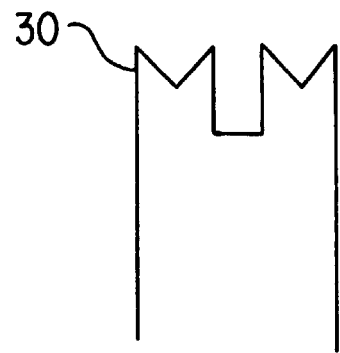
Figure 19:
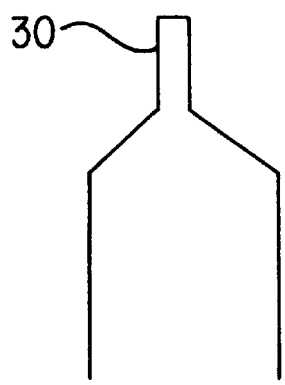
Figure 20:
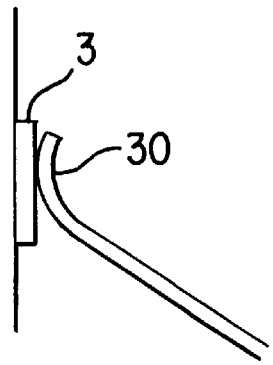

The shape of the spring contact tip 30 can take different forms, depending on the application. Since the spring contacts 15 are photolithographically patterned, the spring contact tips 30 are easily formed in a variety of shapes. FIG. 15 shows a spring contact tip 30 having a flat end. The spring contact tip 30 shown in FIG. 16 has a pointed end which concentrates the force $F_{tip}$ exerted by the spring contact 15 at a single point on the contact pad 3. This pointed shape aids the spring contact tip 30 when breaking through some oxides which may be present on the contact pads 3. FIGS. 17 and 18 show spring contact tips 30 having multiple points for applications where contact redundancy is required. FIG. 19 shows a spring contact tip 30 having a deformable tab. The deformable tab increases the contact area with the contact pad 3, by deforming as shown in FIG. 20 when the spring contact 15 forces the tip 30 against the contact pad 3.

In probing applications, to reduce wear of the spring contact tips 30 due to abrasion with hard native oxides on contact pads 3, the spring contacts 15, or alternatively only the tips 30, can be made from harder alloys, such as those based on tungsten (W) or chromium (Cr) as discussed above. Increasing the hardness of the spring contact tips 30 is important because, for example, the spring contact tips 30 used for probing are expected to survive approximately $3 \times 10^5$ touchdowns, that is contacts, with different contact pads 3, each having a hard native oxide formed on the surface of the contact pad 3. Increasing the hardness of the spring contact tips 30 means that the spring contact tips 30 wear at a slower rate than tips 30 formed of a softer material. Alloying of the tungsten or chromium-based alloys is done to reduce brittleness and increase the toughness of pure tungsten or chromium. However, alloying of the tungsten or chromium is not required.

In addition, electrically conductive compounds, such as titanium nitride (TiN), diamond-like carbon (DLC), molybdenum-disulfide ($MoS_2$) and tin dioxide ($SnO_2$) can be used to coat the spring contact tips 30 to improve electrical contact and wear properties of the spring contact tips 30. Titanium nitride and diamond-like carbon increases the wear life of the tips 30 because the materials have a high hardness, and the materials reduce galling of the spring contact tips 30 and the contact pad 3. Titanium nitride and diamond-like carbon reduce galling because these materials have a reduced tendency to bond to metals, such as aluminum. Molybdenum sulfide and tin dioxide have a high lubricity, and therefore reduce friction between the spring contact tips 30 and the contact pad 3 without reducing the ability of the tips 30 to scrub through hard native oxides on the contact pad 3.

In more permanent contacting applications, other methods are used to lower the contact resistance between the spring contact tip 30 and the contact pad 3. The spring contact tips 30 can be ultrasonically scrubbed into the contact pads 3 to increase the area of contact. Also, the spring contact tips 30 and/or the contact pads 3 can be coated with solder which is melted after the tips 30 and the contact pads 3 are brought into contact. Melting the solder bonds the spring contacts 15 to the contact pads 3, as shown in FIG. 21.

The spring contacts 15 can also be bonded to the contact pads 3 by using an electrically conductive epoxy or other adhesive, or by laser welding the spring contacts 15 to the contact pads 3.

Figure 21:
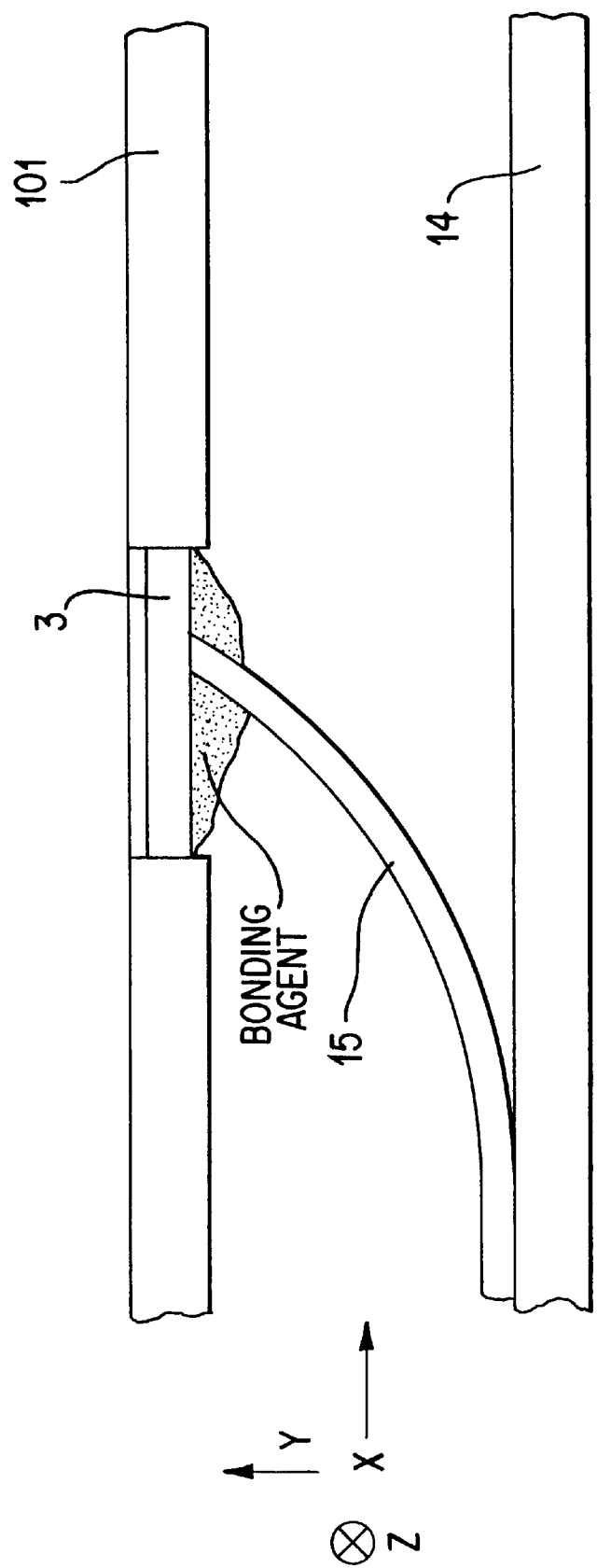
FIG. 21 shows a tip of a spring contact bonded to a contact pad.

One possible drawback to bonding the spring contact 15 to the contact pad 3 at the spring contact tip 30 is that any relative movement between the substrate 14 and the device 101 in the x direction, as shown in FIG. 21, can unduly stress the joint between the spring contact 15 and the contact pad 3. This is because the spring contact 15 is relatively stiff in the x direction as compared to the y and z directions shown in FIG. 21. Relative movement between the device 101 and the substrate 14 can be caused by vibration, mechanical shock, and/or thermal cycling.

Figure 22:
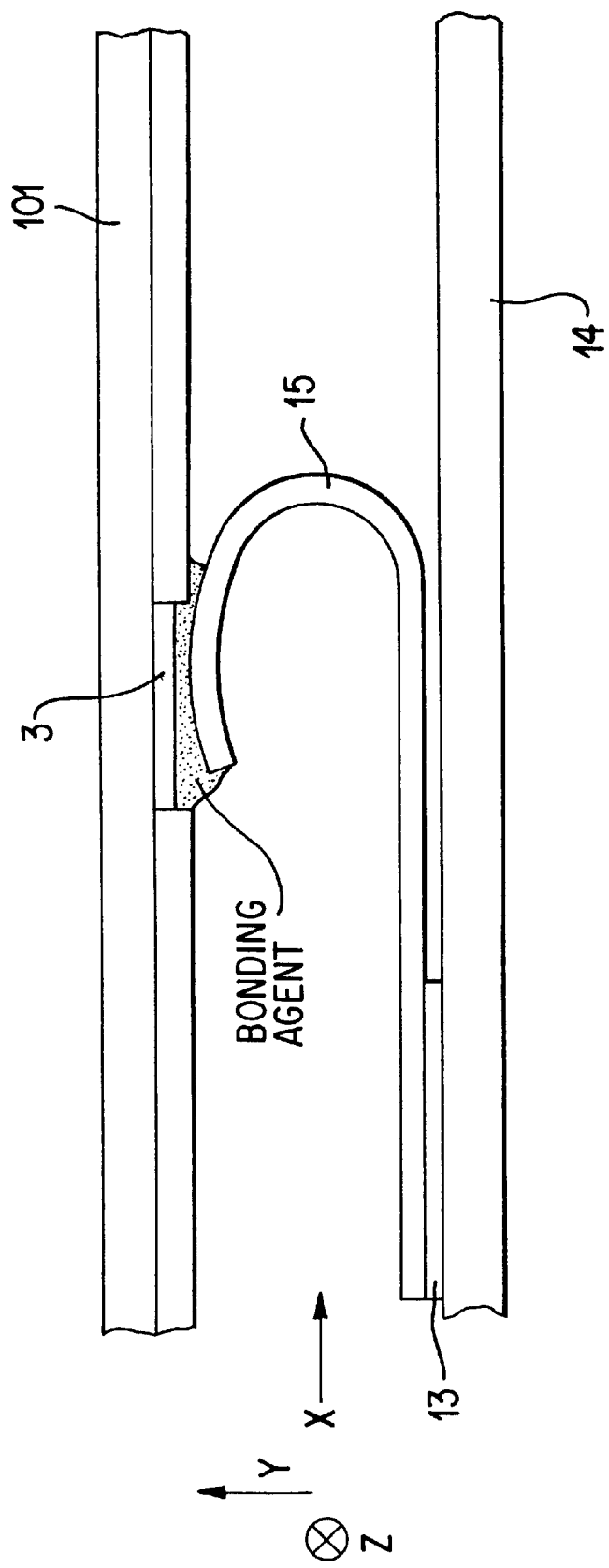
FIG. 22 shows a "shepherd's hook"-type spring contact bonded to a contact pad.

To avoid stressing the spring contact 15/contact pad 3 joint in such situations, the spring contact 15 can be constructed in a "shepherd's-hook"-type arrangement, as shown in FIG. 22. To construct the spring contact 15 shown in FIG. 22, the length of the free portion 11 that is released from the substrate 14 is increased so that the spring contact 15 curves back upon itself, thereby defining an arc of at least 180°. Therefore, when the spring contact 15 shown in FIG. 22 is bonded to the contact pad 3, relative movement between the device 101 and the substrate 14 in the x direction does not stress the spring contact 15/contact pad 3 joint as much as the arrangement shown in FIG. 21. The reason is that the relative movement in the x direction is compensated for by flexure in the curved portion of the spring contact 15 between the contact pad 3 and the substrate 14. An additional advantage of the spring contact 15 structure shown in FIG. 22 is that the "shepherd's-hook" structure presents a larger bonding area than the spring contact tip 30. Therefore, the bond between the spring contact 15 and the contact pad 3 is stronger than the bond between the spring contact tip 30 and the contact pad 3.

Figure 23:
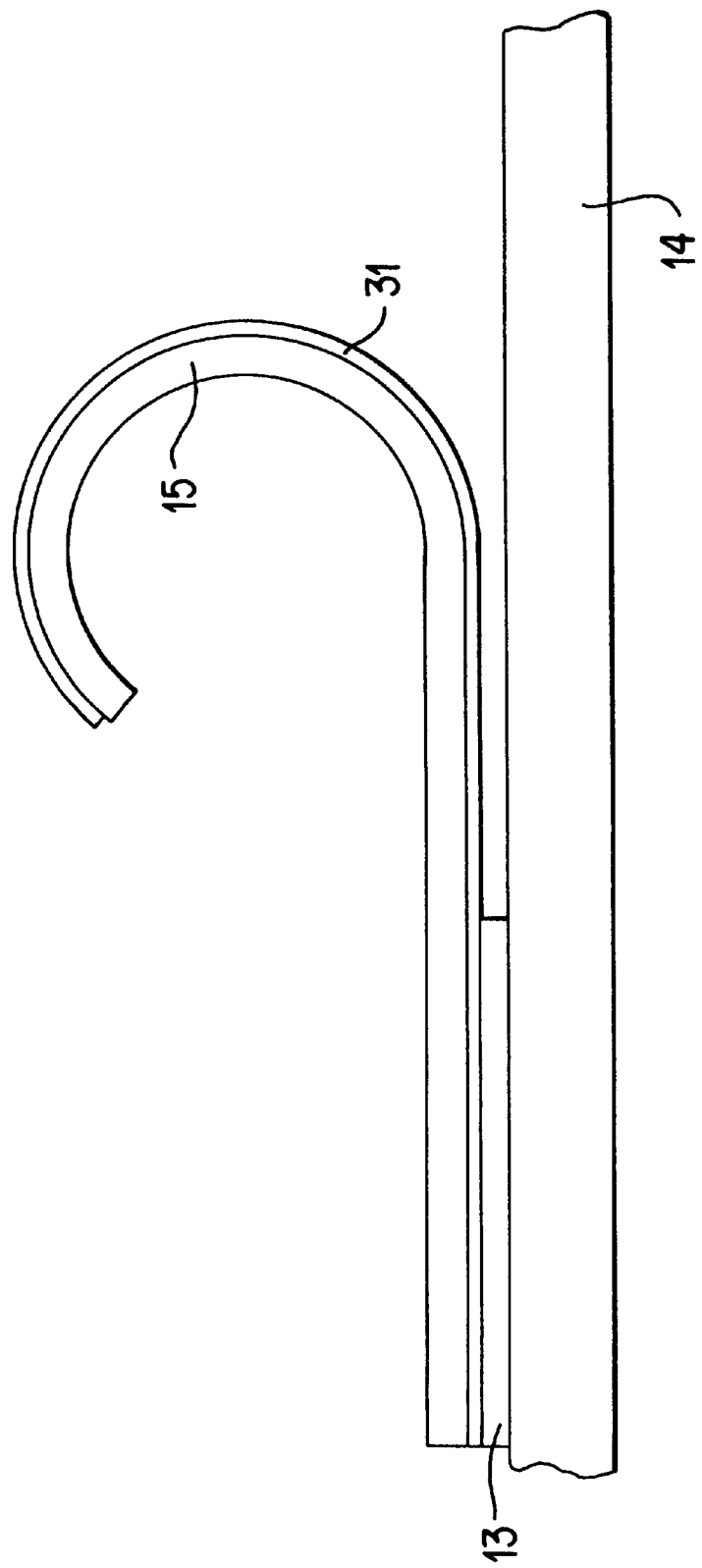
FIG. 23 shows a shepherd's hook-type spring contact having a gold wetting layer.

A preferred arrangement for the "shepherd's-hook"-type spring contact 15 is to provide a gold wetting layer 31 on the outer circumference of the spring contact 15, as shown in FIG. 23. However, any other conductive wettable material can be used. When the gold wetting layer 31 is used, a layer of gold is deposited on the release layer 13 before the spring finger 15 is deposited. Thus, when the release layer 13 is under-cut etched as discussed above, the gold wetting layer 31 is released from the substrate 14 and the spring finger 15 curls up as shown in FIG. 23. Alternatively, an additional adherence layer could be added under the gold, but on top of the release layer 13. The additional adherence layer (not shown) is preferably made of metal to provide good bonding between the gold and the adherence layer, and is preferably made of a chemically active metal so that the adherence layer will react with and bond well to the release layer 13. Titanium and chromium are two commonly used adherence metals, and titanium is preferred because it can be etched with high selectivity to the gold and the spring contact 15 by plasma etching with fluorine atoms. Of course, the gold wetting layer 31 could be added using an electroless plating process as discussed above with respect to FIG. 12.

Figure 24:
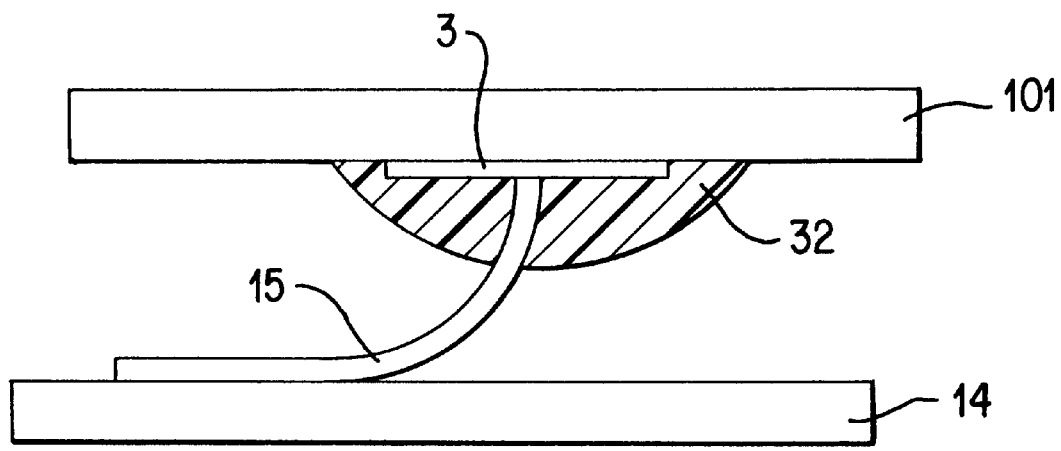
FIGS. 24 and 25 show a linear chain conducting polymer applied to a spring contact/contact pad connection.
Figure 25:
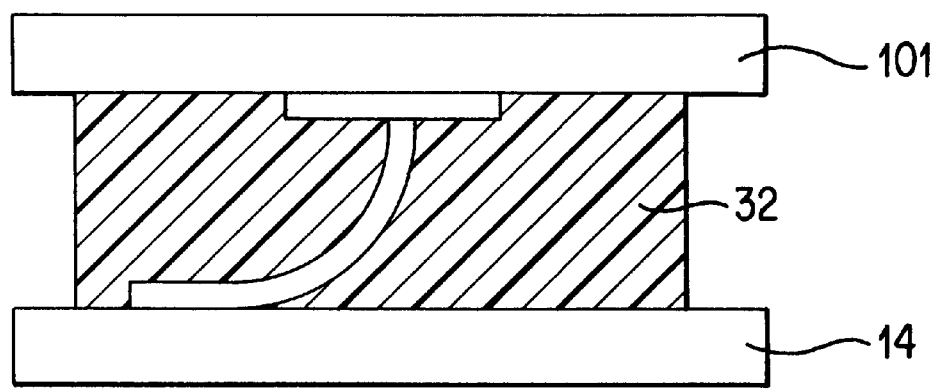

An additional technique for improving the spring contact 15/contact pad 3 connection is to provide a high viscosity, low vapor pressure liquid consisting of a high molecular weight linear chain conducting (LCC) polymer 32 around the connection, as shown in FIG. 24 or FIG. 25. In FIG. 24, the LCC polymer 32 is only applied locally near the spring contact 15/contact pad 3 connection. The LCC polymer 32 can be applied, for example, by spraying or injecting the polymer 32. In FIG. 25, the LCC polymer 32 completely fills the void between the substrate 14 and the device 101.

The LCC polymer 32 is designed to have the property that in the presence of a sufficiently high electric field, the LCC polymer 32 switches from an insulating material to a conducting material. PolyStyrene-PolyMethlMethAcrylate (PS-PMMA) is one polymer that appears to have such properties. The LCC polymer 32 molecule is only conductive along its longitudinal axis. Therefore, when the LCC polymer 32 is first applied to the spring contact 15/contact pad 3 connection, the molecules in the LCC polymer 32 are randomly oriented, and therefore are in an insulating state. However, when an electric field of sufficient strength is applied, the molecules align with the electric field, thereby increasing the conductivity of the LCC polymer 32 in the direction of the electric field. Accordingly, in the region of close proximity to the spring contact 15/contact pad 3 connection where poor electrical contact exists, and thus a high electric field exists, the LCC polymer 32 in the region converts to a conductive state in the direction of the electric field. Thus, the LCC polymer 32 compensates for electrical disconnect between the spring contact 15 and the contact pad 3 by becoming conductive only locally where the disconnect occurs. Portions of the LCC polymer 32 farther away from the region where disconnect occurs do not become electrically conductive because the electric field caused by a disconnect is not strong enough to reorient the molecules in the polymer 32.

Further, if the LCC polymer 32 is of sufficiently high viscosity and low vapor pressure, the LCC polymer 32 will act as a barrier material preventing the introduction of contaminants, such as free oxygen or other materials, which would degrade the quality of the electrical contact.

Figure 26:
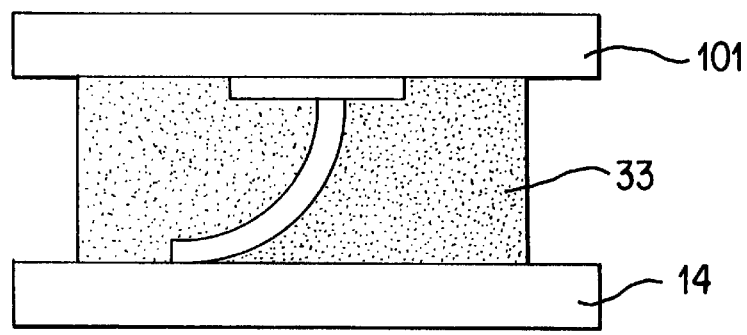
FIG. 26 shows an adhesive used to bond a substrate and a device together.

An additional technique for stabilizing a connection between a spring contact 15 and a contact pad 3 is shown in FIG. 26. In FIG. 26, an insulating adhesive 33 fills the space between the substrate 14 and the device 101. Therefore, when the adhesive 33, such as a UV-cured adhesive, is cured, not only is the spring contact 15 physically bonded to the contact pad 3, but the substrate 14 is physically bonded to the device 101. Accordingly, relative movement between the substrate 14 and the device 101 can be prevented. In addition, the adhesive 33 provides a sealing function against atmospheric contaminants and, if properly selected, the adhesive 33 does not contribute contaminants of its own. When the adhesive 33 is cured, the adhesive 33 undergoes a slight contraction, up to 4%, which increases the compressive force of the spring contact 15 into the contact pad 3. This compression is caused by shrinkage of the adhesive 33 in the y direction, as shown in FIG. 26. The adhesive 33 shrinks in the y direction rather than the x direction because when the adhesive 33 is bonded to the substrate 14 and the device 101, the substrate 14 and the device 101 resist shrinkage of the adhesive 33 in the x direction. The additional compressive force provided between the spring contact 15 and the contact pad 3 will remain over a relatively wide temperature range, providing of course that the differential thermal expansion of the adhesive 33 relative to the contacts does not exceed the initial contraction value of, for example, 4%.

Figure 27:
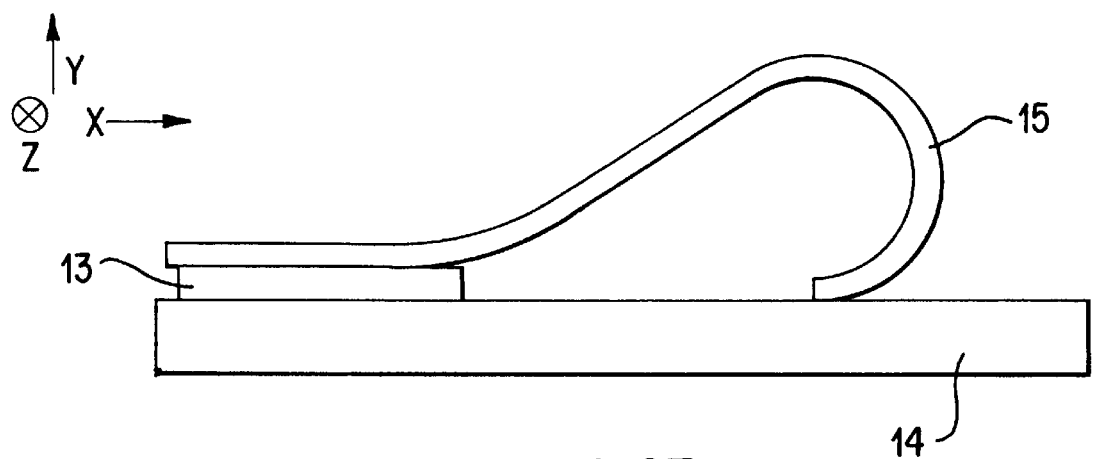
FIG. 27 shows an inverted shepherd's hook-type spring contact.
Figure 28:
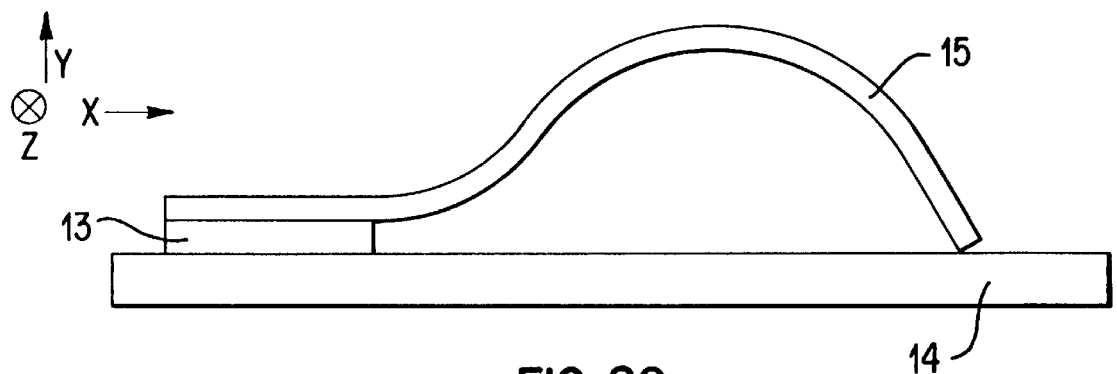
FIG. 28 shows a variation of the inverted shepherd's hook-type spring contact.

FIGS. 27 and 28 show spring contacts 15 formed by the method described above, except that the stress gradient $\Delta\sigma/h$ in the spring contact 15 is reversed. That is, the bottom-most layer 16-1 has a tensile stress, while upper layers 16-x have decreasing levels of tensile stress and/or increasing levels of compressive stress. Therefore, when the free portion 11 of the spring contact 15 is released from the substrate 14, the free portion 11 bends so that the spring contact 15 moves up and away from the substrate 14. This configuration has an advantage over other configurations where the free portion 11 does not contact the substrate 14 after the free portion 11 is released, e.g., FIG. 6, in that the free portion 11 tends not to move too freely in the z direction shown in FIGS. 27 and 28. This is an advantage in fine-pitch contact applications where the spring contacts 15 are spaced closely together, e.g., less than 10 $\mu$m apart, and can become entangled with each other.

The spring contacts 15 are not limited to interconnecting a chip 2 to a substrate 14 or circuit board. The spring contacts 15 are used equally well to interconnect two chips 2, two circuit boards, or other electronic devices to each other. Two exemplary applications are mounting driver chips to visual displays and assembling multi-chip modules (MCM's) for computers. Another alternative use for the spring contacts 15 is in probe cards. As discussed above, probe cards 7 are used to temporarily connect two devices, typically when one of the devices is tested. Such testing is common in the semiconductor industry, where the probe cards 7 are used to test semiconductor chips while the chips are still part of a single-crystal silicon wafer.

Figure 29:
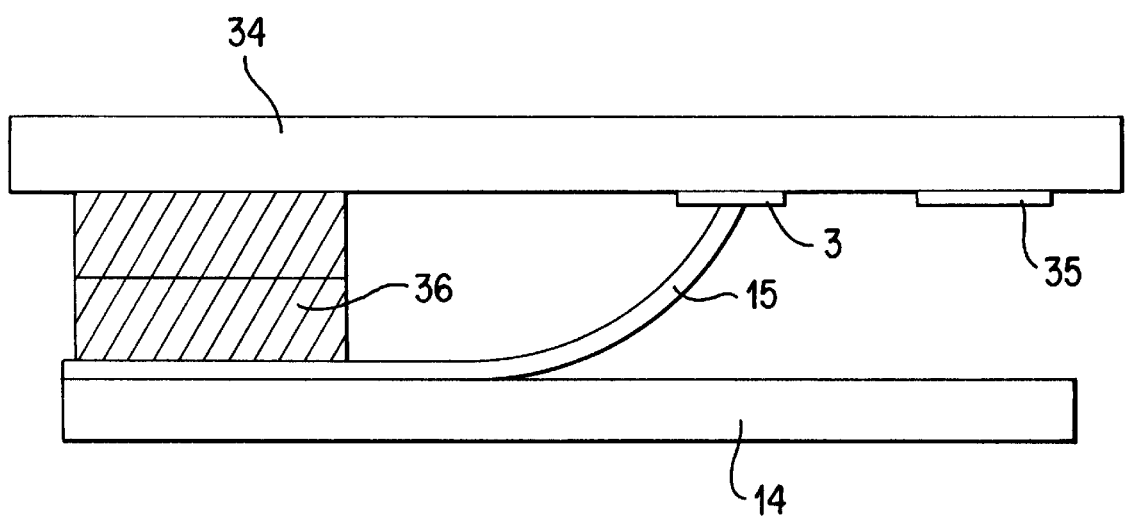
FIG. 29 shows a contacting application for the spring contacts.
Figure 30:
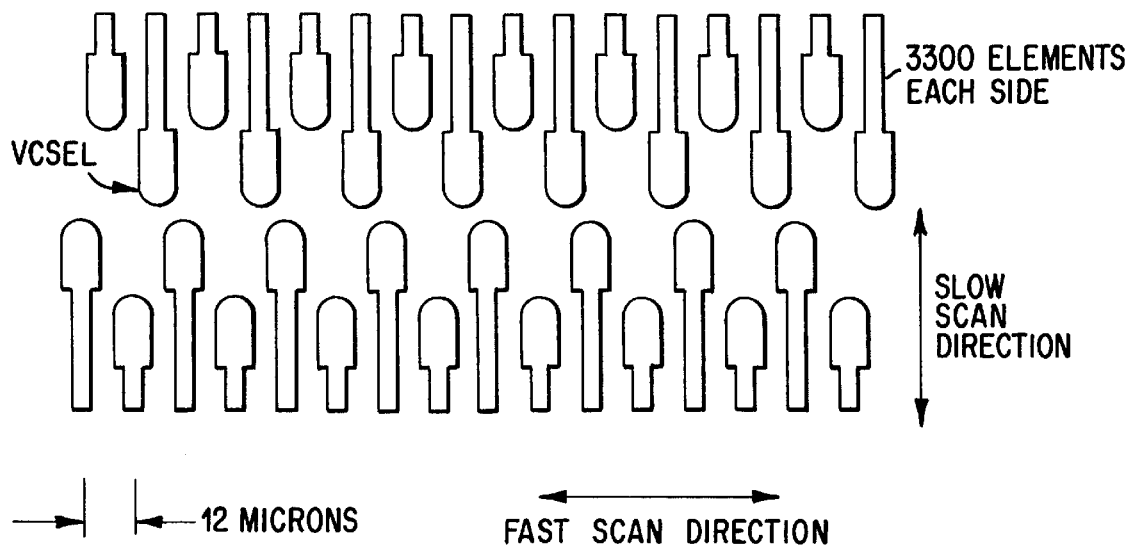
FIG. 30 shows a VCSEL layout for use in a single chip image bar for page width printing.

FIG. 29 is one example of the many different kinds of applications in which spring contacts 15 can be used to interconnect two devices. In the example shown in FIG. 29, the spring contacts 15 are used to interconnect a substrate 14 to a gallium-arsenide (GaAs) substrate 34. The GaAs substrate 34 has an array of vertical cavity surface emitting lasers (VCSELs) 35 arranged on a lower surface of the GaAs substrate 34. By using the spring contacts 15 as opposed to other connection methods, such as wirebonding, tab bonding or solder bump bonding, the VCSELs 35 can be arranged in a very closely spaced array on a single GaAs chip, and therefore used, for example, as part of a single chip image bar for page-width printing. By staggering the VCSELs 35 as shown in FIG. 30, an effective spacing of 6 microns between each VCSEL 35 can be achieved, thereby providing an effective pitch of approximately 600 dots per inch when magnified through a 7x projection lens.

Also arranged on a lower surface of the GaAs substrate 34 is an array of contact pads 3 that can be positioned in a closely spaced array similar to the VCSELs 35, e.g., 12 micron spacing between a staggered array of contact pads 3. The contact pads 3 either communicate directly with the VCSELs 35 or communicate with other circuitry (not shown) that communicates with the VCSELs 35. Therefore, when the spring contacts 15 interconnect the substrate 14 and the GaAs substrate 34, the VCSELs 35 can be controlled by control circuitry (not shown), which is on the substrate 14 or connected to the substrate 14. A spacer 36 maintains a desired spacing between the substrate 14 and the GaAs substrate 34.

Figure 31:
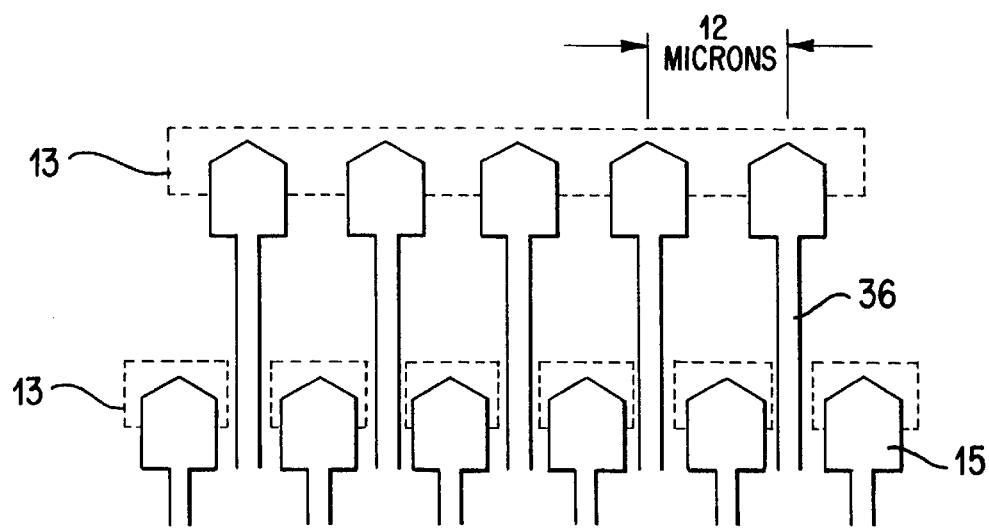
FIG. 31 shows an array of spring contacts for contacting an array of contact pads on the single chip image bar.

To interconnect the substrate 14 and the GaAs substrate 34, the spring contacts 15 can be arranged in an array, as shown in FIG. 31, that corresponds to the contact pad 3 array on the GaAs substrate 34. Note that the release layers 13 for the lower array of spring contacts 15 in FIG. 31 are patterned into islands to avoid releasing the signal lines 36 during the process of releasing the spring contacts 15 from the substrate 14. Alternatively, etching of a continuous release layer 13 through a mask can be used instead of using island-shaped release layers 13. The release layer 13 for the upper array of spring contacts 15 is patterned into a single island since there is no concern for releasing any signal lines 36. The arrangement of the spring contacts 15 shown in FIG. 29 can be reversed. That is, the spring contacts 15 can be fixed to the GaAs substrate 34 and make contact with contact pads 3 that are formed on the substrate 14. In addition, other emission devices, such as light emitting diodes or edge emitting lasers can be used in place of the VCSELs 35.

While the invention has been described with reference to specific embodiments, the description of the specific embodiments is illustrative only and is not to be construed as limiting the scope of the invention. Various other modifications and changes may occur to those skilled in the art without departing from the spirit and scope of the invention as set forth in the following claims.

What is claimed is:

1. An electrical contact comprising;
   a contact pad;
   a spring contact in physical contact with the contact pad, the spring contact comprising,
   an elastic material that is initially fixed to a substrate,
   an anchor portion fixed to the substrate, and
   a free portion; and
   a linear chain conducting polymer positioned at a point of physical contact between the spring contact and the contact pad;
   wherein when the elastic material of the spring contact is released from the substrate, the elastic material bends away from the substrate in response to being released and forces the free portion into contact with the contact pad.

2. The electrical contact of claim 1, wherein the linear chain conducting polymer has a high viscosity and a low vapor pressure.

3. The electrical contact of claim 1, wherein the linear chain conducting polymer is a PS-PMMA diblock copolymer.

4. The electrical contact of claim 1, wherein the elastic material comprises:

a top; and a bottom, at least a portion of the bottom of the elastic material being initially fixed to the substrate;

wherein a part of the elastic material near the bottom has a higher inherent tensile stress relative to a part of the elastic material near the top, and when the bottom of the elastic material is released from the substrate, a portion of the elastic material curls up and away from the substrate so that the free portion contacts the contact pad.

5. The electrical contact of claim 1, wherein the free portion of the spring contact curls up and away from the substrate to define at least one arc totaling at least 180°.

6. A contact structure comprising:

a device having at least one contact pad;

a substrate having at least one spring contact that makes contact with a corresponding contact pad on the device; and an adhesive that bonds the device to the substrate and surrounds the at least one spring contact and contact pad;

the at least one spring contact comprising:

an elastic material that is initially fixed to a substrate;

an anchor portion fixed to the substrate; and a free portion;

wherein when the elastic material is released from the substrate, the elastic material bends away from the substrate in response to being released and forces the free portion into contact with the contact pad.

7. The contact structure of claim 6, wherein the adhesive is a UV curable adhesive.

8. The contact structure of claim 6, wherein the adhesive contracts and increases a force of contact between the spring contact and the contact pad.

9. The contact structure of claim 6, wherein the at least one spring contact has a top, and a bottom, at least a portion of the bottom of the elastic material being initially fixed to the substrate;

wherein the portion of the bottom of the elastic material is released from the substrate, and the free portion curls up and away from the substrate when the portion is released to define at least one arc totaling at least 180°.

10. A spring contact comprising:

an elastic material that is initially fixed to a substrate;

an anchor portion fixed to the substrate; and a free portion;

wherein the elastic material is released from the substrate, the elastic material bends away from the substrate in response to being released and forces the free portion into contact with a contact pad; and wherein a surface of the free portion comprises a material that one of increases the hardness of the free portion and lubricates the free portion.

11. The spring contact of claim 10, wherein the material is one of titanium nitride, diamond-like carbon, molybdenum-disulfide, and tin dioxide.

12. The spring contact of claim 10, wherein the free portion is made substantially of tungsten or chromium.

13. An image bar comprising:

a substrate having circuitry formed on the substrate;

a device having at least one emission device;

at least one spring contact formed on one of the substrate and the device, the spring contact comprising:

an elastic material that is initially fixed to a surface on one of the substrate and the device;

an anchor portion fixed to the surface; and a free portion;

at least one contact pad formed on the other of the substrate and the device; and an adhesive that contacts and bonds the device to the substrate and surrounds the at least one spring contact and contact pad;

wherein the elastic material of the at least one spring contact is released from the surface, the elastic material bends away from the surface in response to being released and forces the free portion into contact with the contact pad, thereby electrically interconnecting the circuitry and the at least one emission device.

14. The image bar of claim 13, wherein the at least one emission device is one of a vertical cavity surface emitting laser, an edge emitting laser, and a light emitting diode.

* * * * *